( 12 ) United States Patent
Eo et al.

(10) Patent No.: US 10,122,188 B2
(45) Date of Patent: Nov. 6, 2018

(54) BATTERY PACK

(71) Applicant: Samsung SDI Co., Ltd., Yongin-si, Gyeonggi-do (KR)

(72) Inventors: Yoon Phil Eo, Yongin-si (KR); Yong Heui Song, Yongin-si (KR)

(73) Assignee: Samsung SDI Co. Ltd., Yongin-si (KR)

( * ) Notice: Subject to any disclaimer, the term of this patent is extended or adjusted under 35 U.S.C. 154(b) by 7 days.

(21) Appl. No.: 15/419,438

(22) Filed: Jan. 30, 2017

(65) Prior Publication Data

US 2017/0250548 A1 Aug. 31, 2017

(30) Foreign Application Priority Data

Feb. 25, 2016 (KR) .......... 10-2016-0022826

(51) Int. Cl.
H02J 7/00 (2006.01)
G01R 31/36 (2006.01)
(Continued)

(52) U.S. Cl.
CPC ........ *H02J 7/0021* (2013.01); *G01R 31/3679* (2013.01); *H01M 10/441* (2013.01);
(Continued)

(58) Field of Classification Search
CPC ...... H02J 7/0021; H02J 7/0026; H02J 7/0068; H02J 7/0091; H02J 2007/0037;
(Continued)

(56) References Cited

U.S. PATENT DOCUMENTS 5,945,812 A 8/1999 Choi
2005/0077878 A1* 4/2005 Carrier ............... B25F 5/00
320/134

(Continued)

FOREIGN PATENT DOCUMENTS

EP 2573858 A1 3/2013
KR 10-2007-0101571 10/2007
KR 10-2009-0126097 12/2009

OTHER PUBLICATIONS

EPO Extended Search Report dated Jul. 24, 2017, for corresponding European Patent Application No. 17157968.3 (10 pages).

*Primary Examiner* — Paul Dinh
(74) *Attorney, Agent, or Firm* — Lewis Roca Rothgerber Christie LLP

(57) ABSTRACT

A battery pack includes a battery including at least one battery cell, a switching element including a charging switch and a discharging switch arranged on a high current path via which a charging current and a discharging current flow, a battery manager configured to monitor a voltage and a current of the battery, and to controlling charging and discharging of the battery based on the voltage of the battery, and a switch driver configured to output a second driving signal for driving the charging switch according to a control signal from the battery manager, wherein the battery manager is further configured to set a charging current limit based on a deterioration degree of the battery, and to control the charging switch by using the switch driver so that a magnitude of the charging current applied to the battery is equal to or less than the charging current limit.

14 Claims, 3 Drawing Sheets

(51) Int. Cl.
  *H01M 10/48* (2006.01)
  *H01M 10/44* (2006.01)
  *H01M 10/42* (2006.01)

(52) U.S. Cl.
  CPC ....... *H01M 10/482* (2013.01); *H01M 10/486* (2013.01); *H02J 7/0029* (2013.01); *H02J 7/0068* (2013.01); *H02J 7/0072* (2013.01); H01M 2010/4271 (2013.01); H02J 2007/0037 (2013.01)

(58) Field of Classification Search
  CPC ............. H02J 2007/0039; H02J 7/0029; H02J 7/0031; G01R 31/3679
  USPC ........................................................ 320/134
  See application file for complete search history.

(56) References Cited

U.S. PATENT DOCUMENTS

| | | |
|---|---|---|
| 2006/0152196 A1 | 7/2006 | Matsumoto et al. |
| 2008/0007223 A1 | 1/2008 | Morioka |
| 2008/0224667 A1 | 9/2008 | Tanaka et al. |
| 2009/0295332 A1 | 12/2009 | Yang et al. |
| 2009/0295334 A1 | 12/2009 | Yang et al. |
| 2012/0049804 A1 | 3/2012 | Kobayashi et al. |
| 2013/0278221 A1 | 10/2013 | Maeda |
| 2014/0203762 A1* | 7/2014 | Kato .................... H02J 7/0031 320/107 |

\* cited by examiner

BATTERY PACK

CROSS-REFERENCE TO RELATED APPLICATION

This application claims priority to and the benefit of Korean Patent Application No. 10-2016-0022826, filed on Feb. 25, 2016, in the Korean Intellectual Property Office, the disclosure of which is incorporated herein in its entirety by reference.

BACKGROUND

1. Field

Aspects of the present invention relate to a battery pack.

2. Description of the Related Art

As portable electronic devices, for example, mobile phones, digital cameras, and laptop computers, are widely used, batteries supplying electric power for operating portable electronic devices are being actively developed. A battery is provided as a battery pack with a protective circuit that controls charging and discharging of the battery, and research into a method and apparatus for effectively charging the battery is being conducted.

When battery degradation occurs, a full charge capacity (FCC) of a battery is reduced. When the battery is charged with an electric current having a fixed magnitude, a charging rate (C-rate) of the battery increases and heating of the battery during the charging operation also increases. In addition, a smart charger capable of controlling a magnitude of an output current is also used, but the smart charger includes an additional device for communicating with a battery pack to receive information about a state of the battery and to accurately adjust the magnitude of the electric current. Thus, the price of the charger rises, and there is a compatibility issue.

SUMMARY

Additional aspects will be set forth in part in the description which follows and, in part, will be apparent from the description, or may be learned by practice of the presented embodiments.

According to one or more embodiments, there is provided a battery pack including: a battery including at least one battery cell; a switching element including a charging switch and a discharging switch arranged on a high current path via which a charging current and a discharging current flow; a battery manager configured to monitor a voltage and a current of the battery, and to output a first driving signal to the charging switch and the discharging switch to control charging and discharging of the battery based on the voltage of the battery; and a switch driver configured to output a second driving signal for driving the charging switch according to a control signal from the battery manager, wherein the battery manager is further configured to set a charging current limit based on a deterioration degree of the battery, and to control the charging switch by using the switch driver so that a magnitude of the charging current applied to the battery is equal to or less than the charging current limit.

In an embodiment, the battery manager is further configured to decrease the charging current limit of the battery as the battery degrades.

In an embodiment, the battery manager is further configured to output a pulse width modulation (PWM) signal having a duty ratio, which is variable based on the magnitude of the charging current applied to the battery, to the switch driver as the control signal.

In an embodiment, the battery manager is further configured to decrease the duty ratio of the PWM signal when the magnitude of the charging current applied to the battery exceeds the charging current limit, and to increase the duty ratio of the PWM signal when the magnitude of the charging current applied to the battery is less than the charging current limit.

In an embodiment, when the duty ratio of the PWM signal reaches 100%, the battery manager is further configured to output a turning-on signal for turning on the charging switch as the first driving signal and to control the switch driver to output the second driving signal in a high impedance (Hi-Z) state.

In an embodiment, when the duty ratio of the PWM signal is less than 100%, the battery manager is further configured to output the first driving signal in a Hi-Z state, and to control the switch driver to output the second driving signal having a duty ratio corresponding to the duty ratio of the PWM signal.

In an embodiment, the battery manager includes: an analog front end (AFE) configured to sense a voltage and a current of the battery and to output the first driving signal to the charging switch and the discharging switch; and a micro-processor configured to control the AFE and the switch driver based on the voltage and current of the battery.

In an embodiment, the battery manager is further configured to set a charging current limit of the battery so that a charging rate (C-rate) of the battery does not exceed a reference charging rate even when the battery degrades.

In an embodiment, the charging current limit of the battery is in proportion to the FCC of the battery.

In an embodiment, the battery manager is further configured to determine a deterioration degree of the battery based on a full charge capacity (FCC) of the battery.

In an embodiment, the battery manager is further configured to determine the deterioration degree of the battery based on a number of charging/discharging cycles of the battery.

In an embodiment, the battery pack further includes a temperature sensor configured to sense a temperature of the battery.

In an embodiment, the battery manager is further configured to set the charging current limit based on the deterioration degree of the battery and the temperature of the battery.

In an embodiment, the battery manager is further configured to set the charging current limit as a first reference value when the temperature of the battery is room temperature, and to set the charging current limit as a second reference value when the temperature of the battery is between a first critical temperature and a second critical temperature, wherein the second reference value is dependent upon the first reference value that is set based on the deterioration degree of the battery.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
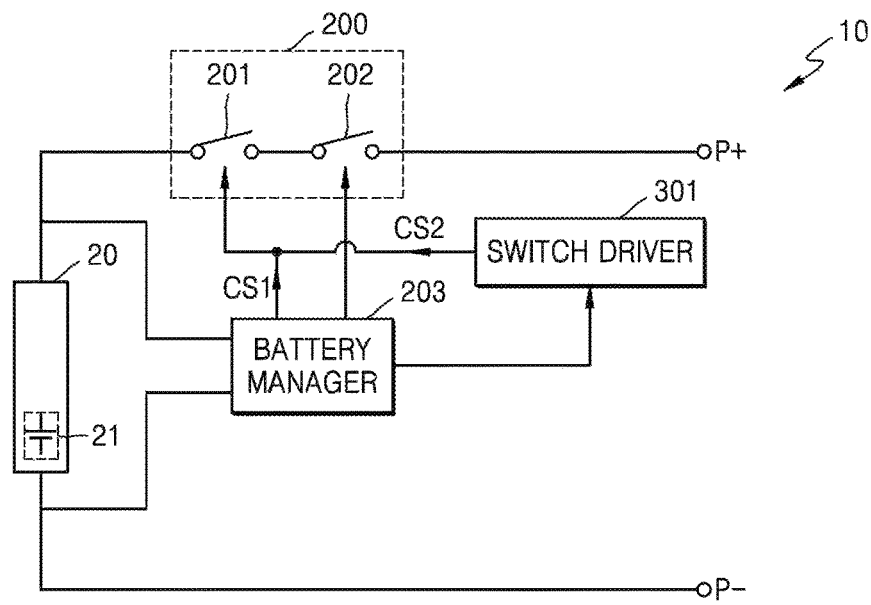
FIG. 1 is a schematic diagram of an internal structure of a battery pack according to an example embodiment of the present invention.

The attached drawings for illustrating one or more embodiments are referred to in order to gain a sufficient understanding, the merits thereof, and the objectives accomplished by the implementation. Hereinafter, the present disclosure will be described in detail by explaining one or more embodiments with reference to the attached drawings. As the present disclosure allows for various changes and numerous embodiments, particular embodiments will be illustrated in the drawings and described in detail in the written description. However, this is not intended to limit the present disclosure to particular modes of practice, and it is to be appreciated that all suitable changes, equivalents, and substitutes that do not depart from the spirit and technical scope are encompassed in the present disclosure. In the description, certain detailed explanations of the related art are omitted when it is deemed that they may unnecessarily obscure the essence of the present disclosure.

For example, specific shapes, structures, and features described in one exemplary embodiment may be modified in another exemplary embodiment within the scope of the present disclosure. In addition, the positions or arrangement of elements described in one exemplary embodiment may be changed in another exemplary embodiment within the scope of the present disclosure. That is, the following description is presented for illustrative purposes and is not intended to limit the scope of the present disclosure. The scope of the present disclosure is defined by the claims and equivalents thereof. In the drawings, like or similar reference numerals denote like or similar elements. Details described in the present disclosure are examples. That is, such details may be changed in other exemplary embodiments within the scope of the present disclosure.

It will be understood that although the terms "first" and "second" are used herein to describe various elements, these elements should not be limited by these terms. Terms are only used to distinguish one element from other elements.

The terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. It will be understood that although the terms "first," "second," etc. may be used herein to describe various components, these components should not be limited by these terms. These components are only used to distinguish one component from another.

Hereinafter, the example embodiments will be described in detail with reference to the accompanying drawings. In the drawings, like reference numerals denote like or corresponding elements, and repeated descriptions thereof will be omitted. As used herein, the term "and/or" includes any and all combinations of one or more of the associated listed items. Expressions such as "at least one of," when preceding a list of elements, modify the entire list of elements and do not modify the individual elements of the list.

Any numerical value recited herein is intended to represent any value within a numerical measurement accuracy range of the recited numerical value as understood by a person of ordinary skill in the art at the time of the present invention. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

FIG. 1 is a schematic diagram of an internal structure of a battery pack 10 according to an example embodiment of the present invention.

Referring to FIG. 1, the battery pack 10 includes a battery 20, a battery manager 203, a switching element 200, and a switch driver 301.

The battery 20 stores power, and includes at least one battery cell 21. The battery 20 may include one battery cell 21 or a plurality of battery cells 21, wherein the battery cells 21 may be connected to one another in series, in parallel, or in combination of serial and parallel connections. The number of battery cells 21 and connection type (configuration) among the battery cells 21 included in the battery 20 may vary depending on a desired output voltage and a power storage capacity.

The battery cell 21 may include a rechargeable secondary battery. For example, the battery cell 21 may include a nickel-cadmium battery, a lead storage battery, a nickel metal hydride (NiMH) battery, a lithium-ion battery, a lithium polymer battery, and/or the like; however, embodiments of the present invention are not limited thereto.

The battery manager 203 controls the switching element 200 for protecting the battery 20. The battery manager 203 may control flow of an electric current into/out of the battery 20 by using the switching element 200. For example, the battery manager 203 may perform over-charge protection, over-discharge protection, over-current protection, over-heating protection, cell balancing, and/or the like.

The battery manager 203 may obtain information about, for example, current, voltage, temperature, remaining power, lifespan, and state of charge (SOC) of the battery 20.

For example, the battery manager 203 may measure a cell voltage and a temperature of the battery cell 21 by using sensors.

When it is sensed that there is an abnormal status such as over-charging, over-discharging, over-current, and high temperature in the battery 20, the battery manager 203 may open a charging switch 201 and/or a discharging switch 202 of the switching element 200 to protect the battery 20. The battery manager 203 may output control signals for controlling the charging switch 201 and/or the discharging switch 202.

The battery manager 203 applies a control signal to the switch driver 301 for controlling an output current of a charger applied to the battery 20. The switch driver 301 outputs a second driving signal CS2 based on the control signal applied from the battery manager 203 and applies the second driving signal CS2 to the charging switch 201, details of which will be described below.

The second driving signal CS2 is a signal for the switch driver 301 to control the charging switch 201, and is output based on the control signal applied from the battery manager 203. The second driving signal CS2 is applied to the charging switch 201 in order to adjust a charging current applied to the battery 20.

According to an embodiment, the battery manager 203 may determine a deterioration degree of the battery 20 based on an open circuit voltage and a current value of the battery 20. The battery manager 203 may set a limit in a charging current applied to the battery 20, based on the determined deterioration degree of the battery 20. In one embodiment, the charging current limit is set to be equal to about a maximum current amount per unit time period, which is allowed to charge the battery 20. The battery manager 203 controls a magnitude of the charging current supplied to the battery 20 in order not to exceed the charging current limit. The charging current limit is continuously reset taking into account proceeding degree of the deterioration of the battery 20.

As shown in FIG. 1, the battery manager 203 may directly control the switching element 200 via a first driving signal CS1.

According to an embodiment, the battery manager 203 determines whether the magnitude of the charging current supplied to the battery 20 exceeds the charging current limit. When the charging current exceeds the charging current limit, the battery manager 203 allows the switch driver 301 to output the second driving signal CS2.

The switch driver 301 may include a level-shifting circuit or a push-pull circuit. The switch driver 301 receives a control signal from the battery manager 203. The switch driver 301 may convert the control signal from the battery manager 203 to the second driving signal CS2 of a certain (preset) level. That is, the switch driver 301 may apply the second driving signal CS2 that may drive the charging switch 201 to the charging switch 201, based on the control signal that the switch driver 301 has received. When the charging switch 201 receives the second driving signal CS2, the charging switch 201 is repeatedly turned on/turned off according to level transition of the second driving signal CS2. The magnitude of the charging current applied to the battery 20 may vary depending on an amount of electric current flowing on the charging switch 201 during a turning-on period. In FIG. 1, the switch driver 301 is a separate circuit block from the battery manager 203; however, embodiments of the present invention are not limited thereto. That is, the switch driver 301 may be located at any position where the switch driver 301 may control the charging switch 201 to adjust the magnitude of the electric current applied to the battery 20.

The switching element 200 is disposed on a high current path, through which the charging current and discharging current flow between the battery 20 and a pack terminal P+. The switching element 200 may suspend the charging and discharging of the battery 20 based on the second driving signal CS2 of the switch driver 301 or the first driving signal CS1 of the battery manager 203. The switching element 200 may include a transistor or a relay. The switching element 200 may include a discharging switch 202 and a charging switch 201 that each includes one or more transistors.

The charging switch 201 receives the second driving signal CS2 from the switch driver 301, and repeatedly turns on/turns off according to the second driving signal CS2. While turning on/turning off of the charging switch 201 are repeatedly performed, a current amount in proportion to a ratio of a turning-on time of the charging switch 201 with respect to a period of time is applied to the battery 20. The current amount has a value that is equal to or less than the charging current limit according to control of the battery manager 203.

According to an embodiment, the battery manager 203 calculates a deterioration degree of the battery 20 by receiving current/voltage information of the battery 20. The battery manager 203 sets the charging current limit to be applied to the battery 20, based on the calculated deterioration degree. Because a full charge capacity (FCC) of the battery 20 decreases as the battery 20 degrades, the battery manager 203 may reduce the charging current limit according to the decrease in the FCC of the battery 20. In this case, the battery manager 203 controls the charging current amount applied to the battery 20 taking into account the deterioration degree of the battery 20, and thus, over-heating of the battery 20 may be reduced or prevented. In addition, even if the charger does not communicate with the battery pack 10, the magnitude of the charging current applied to the battery 20 may be controlled.

According to an embodiment, in a case where the battery pack 10 is connected to a charger having an output current with a fixed magnitude and the magnitude of the output current exceeds the charging current limit, the battery manager 203 controls the charging switch 201 by using the switch driver 301 so that the charging current that is equal to or less than the charging current limit may be applied to the battery 20. The switch driver 301 outputs the second driving signal CS2 and applies the second driving signal CS2 to the charging switch 201 according to control of the battery manager 203. The charging switch 201 is repeatedly turned on/turned off according to the second driving signal CS2, and the battery manager 203 may control the magnitude of the charging current applied to the battery 20 by adjusting the ratio of turning-on time (on time or period) of the charging switch 201 with respect to one period of time.

However, in a case where the charging current having a fixed magnitude is applied to the battery 20 without considering the deterioration degree of the battery 20, heating of the battery 20 becomes severe as the deterioration of the battery 20 proceeds. When the battery 20 degrades, the FCC of the battery 20 is decreased, and if the charging current having the fixed magnitude is continuously applied to the battery 20 even when the FCC of the battery 20 decreases, a charging rate (C-rate) of the battery 20 increases. When the heating of the battery 20 worsens, deterioration of the battery 20 may be accelerated. Consequently, applying of the output current from the charger with the fixed magnitude to the battery 20 without taking into account the deterioration degree of the battery 20 may hinder the battery 20 from achieving longer lifespan. Also, when a smart charger that communicates with the battery pack 10 is used to adjust the output current according to the deterioration state of the battery 20 is used, price of the charger may increase or there may be a compatibility issue with the battery pack 10.

Figure 2:
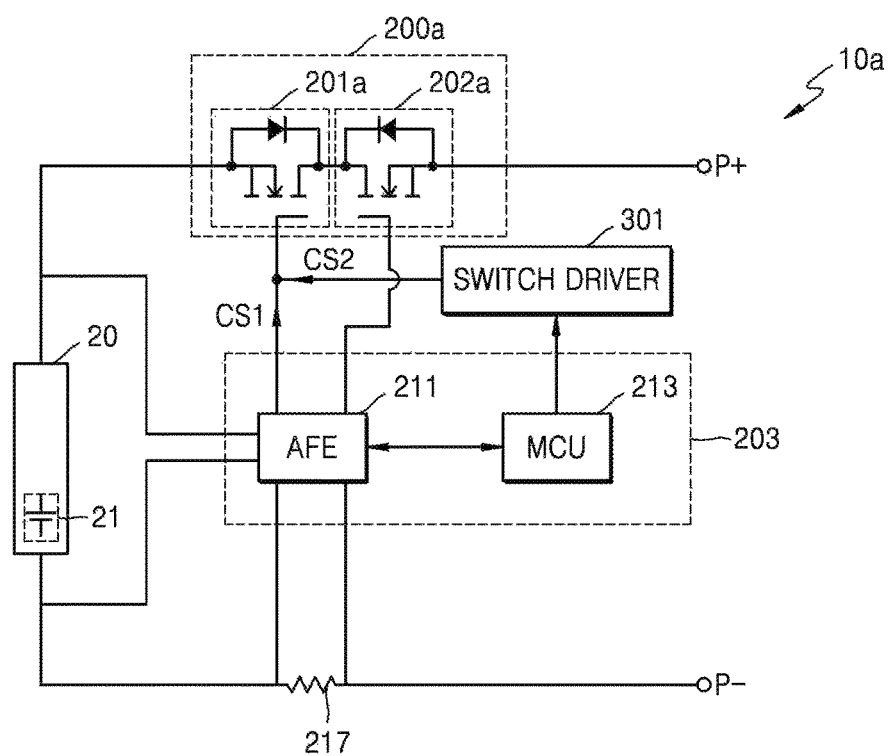
FIG. 2 is a schematic diagram of an internal structure of a battery pack according to an example embodiment of the present invention.

FIG. 2 is a schematic diagram of an internal structure of a battery pack 10a according to an example embodiment of the present invention.

Referring to FIG. 2, the battery pack 10a includes the battery 20, a switching element 200a, the switch driver 301, and the battery manager 203. The battery 20 corresponds to the battery 20 illustrated with reference to FIG. 1, and thus detailed descriptions thereof may not be repeated.

The battery manager 203 includes a micro-control unit (e.g., a micro-controller or MCU) 213 and an analog front end (AFE; also known as an AFE circuit) 211.

The switching element 200a may include a charging switch 201a and a discharging switch 202a, each of which may include a MOSFET. Drains and sources of the charging switch 201a and the discharging switch 202a are disposed on the high current path of the battery 20. A gate of the charging switch 201a is electrically connected to the AFE 211 and the switch driver 301 to receive the control signal. A gate of the discharging switch 202a is electrically connected to the AFE 211 to receive the control signal.

In addition, a parasitic diode of the charging switch 201a is disposed so that a direction in which the discharging current from the battery 20 flows (a direction from a cathode terminal of the battery 20 towards the pack terminal P+) becomes a forward direction. When the charging switch 201a is turned off, the charging current to the battery 20 is blocked. The parasitic diode of the discharging switch 202a is disposed (arranged) so that a direction in which the charging current to the battery 20 flows (a direction from the pack terminal P+ towards the cathode of the battery 20) becomes a forward direction. When the discharging switch 202a is turned off, the discharging current from the battery 20 is blocked. In FIG. 2, a P-type MOSFET is exemplarily shown, however, embodiments of the present invention are not limited thereto. For example, an N-type MOSFET may be used as the charging switch 201a and/or the discharging switch 202a.

The AFE 211 is electrically connected to a cathode and an anode of a battery cell. In addition, the AFE 211 is electrically connected to the gate of the charging switch 201a and the gate of the discharging switch 202a. The AFE 211 senses the voltage and the current of the battery 20 and converts the sensed voltage and current to digital data to output the digital data to the micro-control unit 213. The magnitude of the current introduced into/discharged from the battery 20 is sensed by a sensor resistor 217. Moreover, the AFE 211 receives a set or predetermined control signal from the micro-control unit 213 to turn on or turn off the switching element 200a.

The micro-control unit 213 includes a micro-processor, a passive device, an active device, and a memory that are electrically connected to the micro-processor. The micro-control unit 213 is electrically connected to the AFE 211 to receive an input of open voltage information from the battery 20, and detects an open voltage of the battery 20. In addition, the micro-control unit 213 outputs a control signal to the AFE 211 to turn on/turn off the switching element 200a. In addition, the micro-control unit 213 may calculate the current that flows during charging and discharging of the battery 20.

According to an embodiment, the micro-control unit 213 may determine a deterioration state of the battery 20 by using an internal algorithm. Deterioration of the battery 20 may depend on a time period of using the battery 20 and an environment in which the battery 20 is used, and an output voltage or a charge capacity of the battery 20 that has degraded are changed. The micro-control unit 213 may set appropriate charging current/voltage in correspondence with the deterioration degree of the battery 20. In more detail, the micro-control unit 213 may set the charging current limit applied to the battery 20, based on the determined deterioration degree. By setting the charging current limit based on the deterioration degree, over-heating of the battery 20 during the charging operation may be prevented or reduced.

The micro-control unit 213 generates a pulse width modulation signal PWM. The micro-control unit 213 applies the pulse width modulation signal PWM to the switch driver 301. The switch driver 301 performs level shift or amplification of the pulse width modulation signal PWM. The pulse width modulation signal that is level shifted or amplified is applied to the gate of the charging switch 201a as the second driving signal CS2. In this case, the micro-control unit 213 may adjust a duty-ratio of the pulse width modulation signal PWM to control the magnitude of the charging current applied to the battery 20. In addition, the charging switch 201a illustrated with reference to FIG. 2 is a P-type MOSFET, and is turned on when a voltage level of the second driving signal CS2 is low and turned off when the voltage level of the second driving signal CS2 is high.

In an example, the charging switch 201a repeatedly turns on/turns off according to the pulse width modulation signal PWM of the second driving signal CS2. The charging current amount applied to the battery 20 may be controlled according to a repetition interval and a repetition period. The repetition interval and the repetition period may vary depending on the duty ratio. The duty ratio may denote a ratio of a turning-on time of the charging switch 201a with respect to one period of time. For example, when the duty ratio decreases, the ratio of the turning-on time of the charging switch 201a is reduced, and the charging current amount applied to the battery 20 also decreases. On the other hand, when the duty ratio increases, the ratio of turning-on time of the charging switch 201a increases, and thus, the charging current amount applied to the battery 20 also increases.

The micro-control unit 213 compares the charging current applied to the battery 20 with the charging current limit. As a result of the comparison, when the charging current exceeds the charging current limit, the duty ratio of the pulse width modulation signal PWM is decreased. Otherwise, when the charging current is equal to or less than the charging current limit, the duty ratio of the pulse width modulation signal PWM is increased. The micro-control unit 213 adjusts the duty ratio to control the magnitude of the charging current applied to the battery 20 to be equal to or less than the charging current limit.

The micro-control unit 213 compares the magnitude of the charging current applied to the battery 20 with the charging current limit. The micro-control unit 213 may change a method for controlling the charging switch 201a according to whether the magnitude of the charging current exceeds the charging current limit. For example, to adjust the magnitude of the charging current, the micro-control unit 213 may apply the pulse width modulation signal PWM to the switch driver 301. The micro-control unit 213 may adjust the duty ratio of the pulse width modulation signal PWM to control the flow of charging current equal to or less than the charging current limit. In addition, if there is no need to control the magnitude of the charging current applied to the battery 20, the micro-control unit 213 applies the control signal to the AFE 211.

According to an embodiment, when a charger is connected to the battery pack 10a, the micro-control unit 213 applies the pulse width modulation signal PWM having a low duty ratio to the switch driver 301 so that a low charging current may flow in order to protect the battery 20. The switch driver 301 applies the second driving signal CS2 that is generated based on the pulse width modulation signal PWM to the gate of the charging switch 201a. When the magnitude of the charging current applied to the battery 20 does not exceed the charging current limit, the micro-control unit 213 increases the duty ratio in order to increase the charging current amount applied to the battery 20. The micro-control unit 213 increases the duty ratio until the magnitude of the charging current applied to the battery 20 reaches the charging current limit.

For example, when an amount of the output current from the charger exceeds the charging current limit, the micro-control unit 213 increases the duty ratio until the magnitude of the charging current applied to the battery 20 reaches the charging current limit. When the charging current reaches the charging current limit at a certain duty ratio, the micro-control unit 213 may apply the pulse width modulation signal PWM to the switch driver 301 until the battery 20 is fully charged. On the other hand, when an amount of the output current from the charger has a magnitude equal to or less than the charging current limit, the micro-control unit 213 may increase the duty ratio to 100%. When the duty ratio is 100%, the micro-control unit 213 may control the charging switch 201a by using the AFE 211.

The micro-control unit 213 may determine the deterioration degree of the battery 20 by calculating the number of charging/discharging cycles or the FCC of the battery 20.

In an example, the micro-control unit 213 may calculate the number of the charging/discharging cycles. When determining the number of the charging/discharging cycles, the micro-control unit 213 may increase the cycle by one when the battery 20 is charged to a certain ratio or greater with respect to the FCC of the battery 20 or discharged to a certain region or greater with respect to the FCC. Also, because a user may randomly charge/discharge the battery 20, instead of using the battery 20 in a full-charged state and a full-discharged state repeatedly, the cycle may increase by one when a total accumulated charging amount or a total accumulated discharging amount reaches an initial capacity or a certain (preset) ratio with respect to the initial capacity.

In addition, the micro-control unit 213 may determine the FCC of the battery 20. The micro-control unit 213 may calculate accumulated charging capacity until the battery 20 is fully charged or may calculate accumulated discharging capacity until the fully charged battery 20 is completely discharged to compensate the previous FCC for the calculated FCC. The micro-control unit 213 may use any suitable method to calculate the FCC of the battery 20 and the number of charging cycles, in addition to or in lieu of the previously described method.

The first driving signal CS1 is a control signal applied to the gate of the charging switch 201a from the AFE 211. The first driving signal CS1 may be output according to an internal algorithm of the AFE 211 or may be output according to the control signal from the micro-control unit 213.

According to an embodiment, when a charger is connected to the battery pack 10a, the second driving signal that is the pulse width modulation signal PWM is applied to the gate of the charging switch 201a to control the magnitude of the charging current applied to the battery 20. In a case where the magnitude of the charging current applied to the battery pack 10a does not exceed the charging current limit while the duty ratio of the pulse width modulation signal PWM reaches 100%, the micro-control unit 213 controls the charging current 201a by using the first driving signal CS1. Here, the second driving signal CS2 enters a high impedance (Hi-z) state.

The second driving signal CS2 is a control signal for the charging switch 201a that is output from the switch driver 301. The second driving signal CS2 is obtained by level-shifting or amplifying the pulse width modulation signal PWM generated by the micro-control unit 213. The second driving signal CS2 is applied to the gate of the charging switch 201a when the charger is connected to the battery pack 10a. The second driving signal CS2 adjusts the magnitude of the charging current applied to the battery 20 according to the duty ratio adjusted by the micro-control unit 213. Here, the first driving signal CS1 enters a Hi-Z state.

According to an embodiment, the micro-control unit 213 may determine the deterioration degree of the battery 20 based on the FCC of the battery 20. As the battery 20 degrades, the FCC is decreased. Therefore, the micro-control unit 213 may determine the deterioration degree based on a difference between the calculated FCC of the battery 20 and the initial FCC of the battery 20. The micro-control unit 213 resets the charging current limit based on the determined deterioration degree. The battery 20 degrades as the FCC has decreased, the micro-control unit 213 reduces the charging current limit in proportion to the decreased FCC of the battery 20. In this case, the micro-control unit 213 adjusts the duty ratio of the pulse width modulation signal PWM in order to control the magnitude of the charging current applied to the battery 20 to not exceed the reset charging current limit.

According to an embodiment, the micro-control unit 213 may set the charging current limit so that the C-rate of the battery 20 may be constant or substantially constant. The micro-control unit 213 sets the charging current limit so that a ratio of the FCC of the battery 20 with respect to the charging current limit has a constant or substantially constant value, taking into account the FCC of the battery 20 as the deterioration proceeds (progresses). In this case, because the C-rate or the battery 20 is constant or substantially constant, over-heating of the battery 20 may be prevented or reduced.

According to an embodiment, the micro-control unit 213 may determine the deterioration degree of the battery 20 based on the number of cycles (e.g., charge or discharge cycles). Because the battery 20 degrades as the number of cycles increases, the micro-control unit 213 may reset the charging current limit in inverse-proportion to the increase in the number of cycles. That is, as the number of cycles increases, the charging current limit may decrease. In addition, the micro-control unit 213 may set the charging current limit based on information about the charging current limit according to the number of cycles stored in a memory unit of the battery manager 203.

According to an embodiment, the first driving signal CS1 and the second driving signal CS2 are applied to the gate of the charging gate 201a via a common path. In this case, while one of the first and second driving signals CS1 and CS2 controls the charging switch 201a, the other needs to enter the Hi-Z state. For example, while the switch driver 301 outputs the second driving signal CS2 to the charging switch 201a, the battery manager 203 outputs the first driving signal CS1 in the Hi-Z state. On the other hand, when the battery manager 203 applies the first driving signal CS1 to the charging switch 201a, the switch driver 301 outputs the second driving signal CS2 in the Hi-Z state. In this case, even when the application paths of the first driving signal CS1 and the second driving signal CS2 are common, the switch driver 301 and the battery manager 203 are not affected by the driving signals thereof.

Figure 3:
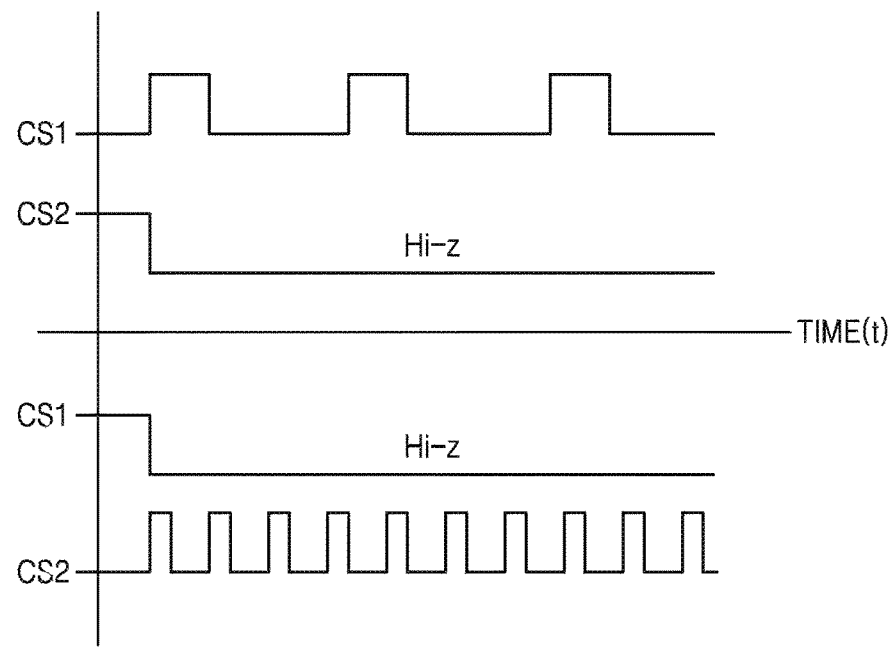
FIG. 3 is a timing diagram exemplarily showing patterns of a first driving signal from an analog front end and a second driving signal from a switch driver.

FIG. 3 is a timing diagram exemplarily showing patterns of the first driving signal CS1 of the AFE 211 and the second driving signal CS2 of the switch driver 301.

The graph of FIG. 3 shows changes in the first driving signal CS1 and the second driving signal CS2 as a function of time. In the graph of FIG. 3, a longitudinal axis denotes a voltage value for driving the charging switch 201a. A horizontal axis of the graph denotes time lapse. The driving signals are input to the charging switch 201a to turn on or turn off the charging switch 201a.

A pulse wave shown as the first driving signal CS1 is a control signal of the charging switch 201a for adjusting the magnitude of the charging current applied to the battery 20. The AFE 211 needs to receive an additional control signal from the micro-control unit 213 whenever the AFE 211 controls the charging switch 201a. If the charging switch 201a is controlled by the micro-control unit 213 every time, a controlling period of the charging switch 201a increases due to communicational load. In addition, when it is necessary to apply the charging current that is much lower than an output current of the charger, a time period of turning off the charging switch 201a also increases. When the time period of turning off the charging switch 201a increases, the charger may determine that the battery 20 is fully charged, and then, the charger may suspend output of the charging current to the battery pack 10.

A pulse wave shown as the second driving signal CS2 is a control signal of the charging switch 201a for adjusting the magnitude of the charging current applied to the battery 20. The pulse wave of the second driving signal CS2 is based on the pulse width modulation signal PWM generated by the micro-control unit 213. The pulse wave of the second driving signal CS2 is obtained by level-shifting or amplifying the pulse width modulation signal PWM. A pulse width and a time duration of one period of the second driving signal CS2 varies depending on adjustment of the duty ratio of the micro-control unit 213. In this case, the switch driver 301 does not need to receive the additional control signal from the micro-control unit 213 whenever the switch driver 301 controls the charging switch 201a. That is, the switch driver 301 may control the magnitude of the charging current applied to the battery 20 only based on the pulse width modulation signal PWM applied thereto, and the micro-control unit 213 may precisely adjust the magnitude of the charging current only by adjusting the duty ratio.

In addition, when the charging switch 201a is controlled by using one of the first driving signal CS1 and the second driving signal CS2, the other driving signal is in the Hi-Z state. Therefore, when the charging switch 201a is controlled by using the second driving signal CS2, the second driving signal CS2 may not be applied to the AFE.

Figure 4:
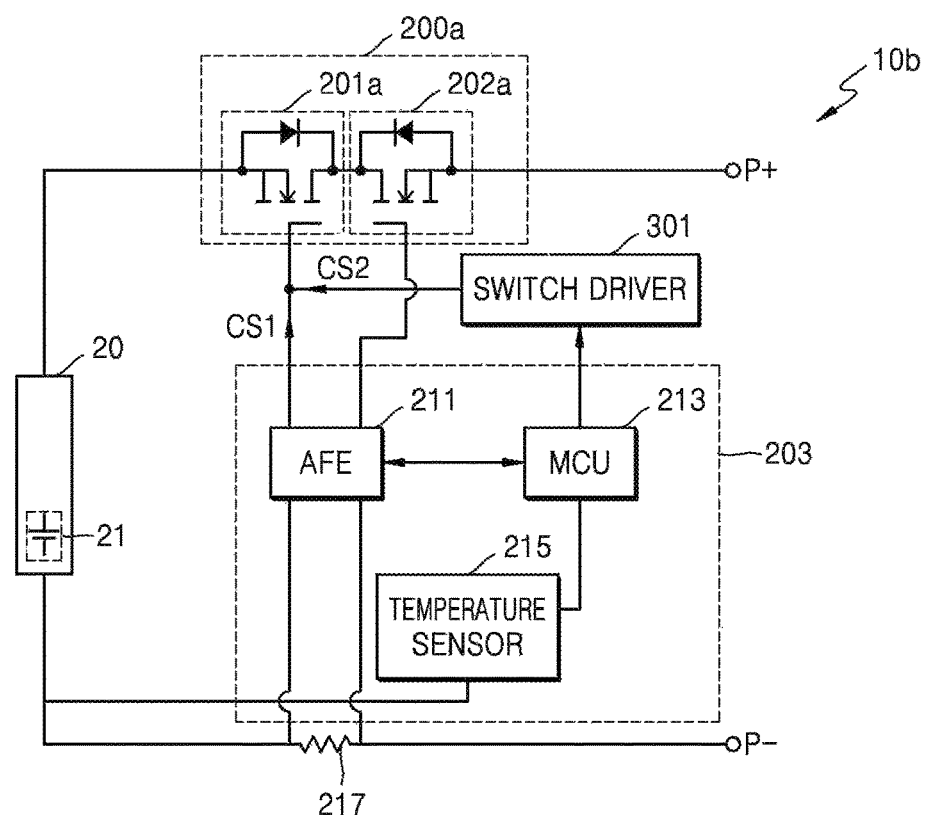
FIG. 4 is a schematic diagram of an internal structure of a battery pack according to an example embodiment of the present invention.

FIG. 4 schematically illustrates an internal structure of a battery pack 10b according to an example embodiment of the present invention.

Referring to FIG. 4, the battery pack 10b includes the battery 20, the battery manager 203, the switching element 200a, and the switch driver 301. Because the battery 20 and the switching element 200a correspond to the battery 20 and the switching element 200a of FIG. 2, and the switch driver 301 corresponds to the switch driver 301 of FIG. 2, detailed descriptions thereof may not be repeated.

The battery manager 203 includes the micro-control unit 213, the AFE 211, and a temperature sensor 215.

The temperature sensor 215 is electrically connected to the micro-control unit 213 and the high current path of the battery 20. The temperature sensor 215 may include a thermistor. In such an example, the micro-control unit 213 may detect a temperature value of the battery 20 by detecting a resistance change rate of the thermistor.

According to an embodiment, the micro-control unit 213 sets a charging current limit by taking into account the deterioration degree of the battery 20 and the temperature of the battery 20 detected by the temperature sensor 215. The charging current limit according to the temperature may be set differently according to a section to which the temperature of the battery 20 belongs, from among a plurality of sections set in advance. For example, because performance of the battery 20 is dependent upon the temperature of the battery 20, the plurality of sections are related to a temperature range, in which the battery 20 is available, and the charging current limit may be differently set according to the sections. The plurality of sections set in advance will be described below with reference to FIG. 5.

Figure 5:
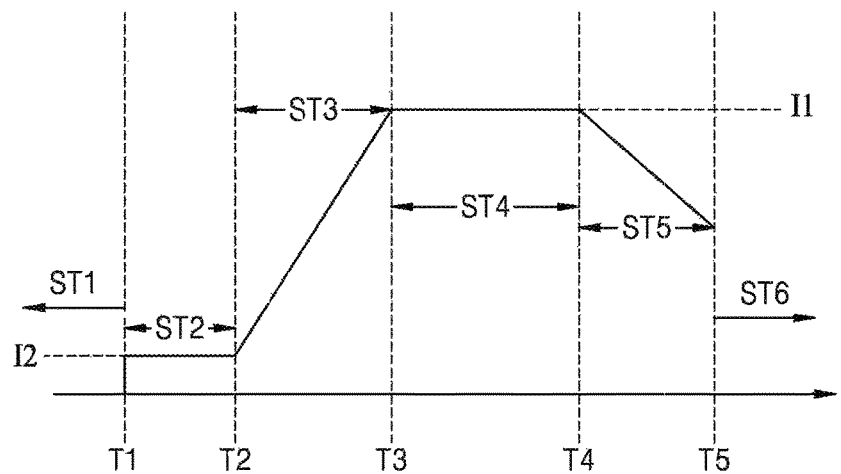
FIG. 5 is a graph showing a charging current and a temperature of a battery according to a method of operating a battery pack, according to an example embodiment of the present invention.

FIG. 5 is a graph showing a charging current and a temperature of the battery 20 according to a method of operating the battery pack 10b, according to an example embodiment of the present invention.

Referring to FIG. 5, the electric current graph shows the charging current limit described above with reference to FIG. 1 as a function of the temperature of the battery 20 in the battery pack 10b of FIG. 4. The current graph of FIG. 5 denotes the charging current limit of the battery 20, and a section in which the charging current limit is 0 is a temperature section in which the charging current applied to the battery 20 is blocked.

A method of setting the charging current limit according to the change in the temperature of the battery 20 will be described below. Each section is divided based on a proceeding speed of deterioration of the battery 20 as a function of temperature. Because the proceeding speed of deterioration in the battery 20 varies depending on a temperature at which the charging is performed, the charging current amount of the battery 20 needs to be differently set with respect to each section. In addition, a first reference value I1 denotes the charging current limit that is set based on the deterioration degree of the battery 20, without taking into account the temperature of the battery 20.

A first section ST1 is a low temperature section, in which a temperature of the battery 20 is lower than a first temperature T1. The first temperature T1 ranges from −30° C. to −10° C. Within the first section ST1, it is shown that the charging current limit has a value of 0, and it is because charging of the battery 20 within the first section ST1 accelerates the deterioration of the battery 20. That is, the battery manager 203 sets the charging current limit to be 0 as shown in the graph, and blocks the charging current applied to the battery 20.

A second section ST2 is a section in which the temperature of the battery 20 is equal to or higher than the first temperature T1 and lower than a second temperature T2. The second temperature T2 ranges from −10° C. to 5° C. Although the second section ST2 is a low temperature section, in which the deterioration of the battery 20 may be accelerated, the deterioration may not be accelerated if the battery 20 is charged by reducing the C-rate to be less than a current amount of a set or predetermined magnitude. The current amount less than a set or predetermined magnitude shown in the graph is dependent upon the first reference value I1, that is, the current amount varies depending on the first reference value I1, and is set to have a certain percentage value with respect to the first reference value I1. Here, a second reference value I2 denotes the current amount less than the set or predetermined magnitude. The certain percentage value may be set according to a state and characteristic of the battery 20.

However, in a case where the battery pack 10b may not adjust the magnitude of the charging current, if the battery 20 is charged with the charging current of the charger set based on a room temperature within the second section ST2, the deterioration speed of the battery 20 rapidly increases.

A third section ST3 is a section in which the temperature of the battery 20 is equal to or higher than the second temperature T2 and less than a third temperature T3. The third temperature T3 may range from 5° C. to 10° C. The third section ST3 is a section, in which performance of the battery 20 is recovered as the temperature rises. Therefore, the charging current limit shown in the graph is denoted in proportion to the change in the temperature of the battery 20. In more detail, in order to reduce the deterioration of the battery 20, the battery manager 203 may increase or decrease the charging current limit according to rising/decreasing of the temperature of the battery 20. That is, when the temperature of the battery 20 reaches the third temperature T3, the battery manager 203 sets the charging current limit as the first reference value I1.

A fourth section ST4 is a room temperature section, in which the temperature of the battery 20 is equal to or higher than the third temperature T3 and less than a fourth temperature T4. The fourth temperature T4 may range from 10° C. to 40° C. The fourth section ST4 is a section, in which the battery 20 operates in normal mode, and there is no need to set the charging current limit differently based on the temperature. Therefore, the charging current limit illustrated in the graph is shown to have a constant value, that is, the first reference value I1. In other words, the battery manager 203 may set the charging current limit to be the first reference value I1 regardless of the temperature variation.

A fifth section ST5 is a section in which the temperature of the battery 20 is equal to or higher than the fourth temperature T4 and equal to or lower than a fifth temperature T5. The fifth temperature T5 may range from 40° C. to 60° C. The fifth section ST5 is a section where performance of the battery 20 degrades as the temperature rises. Therefore, the charging current limit shown in the graph is illustrated to have a value in inverse-proportion to the temperature variation of the battery 20. That is, in the fifth section ST5, the battery manager 203 decreases the charging current limit when the temperature of the battery 20 rises, and increases the charging current limit when the temperature of the battery 20 decreases. As such, the charging current limit is decreased according to the rising of the temperature of the battery 20, so as to reduce progress of the degradation of the battery 20. In addition, when the temperature of the battery 20 reaches the fifth temperature T5, the battery manager 203 sets the charging current limit as 0 to block the supply of the charging current to the battery 20.

A sixth section ST6 is a high temperature section where the temperature of the battery 20 exceeds the fifth temperature T5. The charging current limit is shown to have a value of 0 in the graph, and it is because the charging of the battery 20 within the sixth section ST6 rapidly accelerates degradation of the battery 20. Therefore, in the sixth section ST6, the battery manager 203 blocks the charging current supplied to the battery 20.

Figure 6:
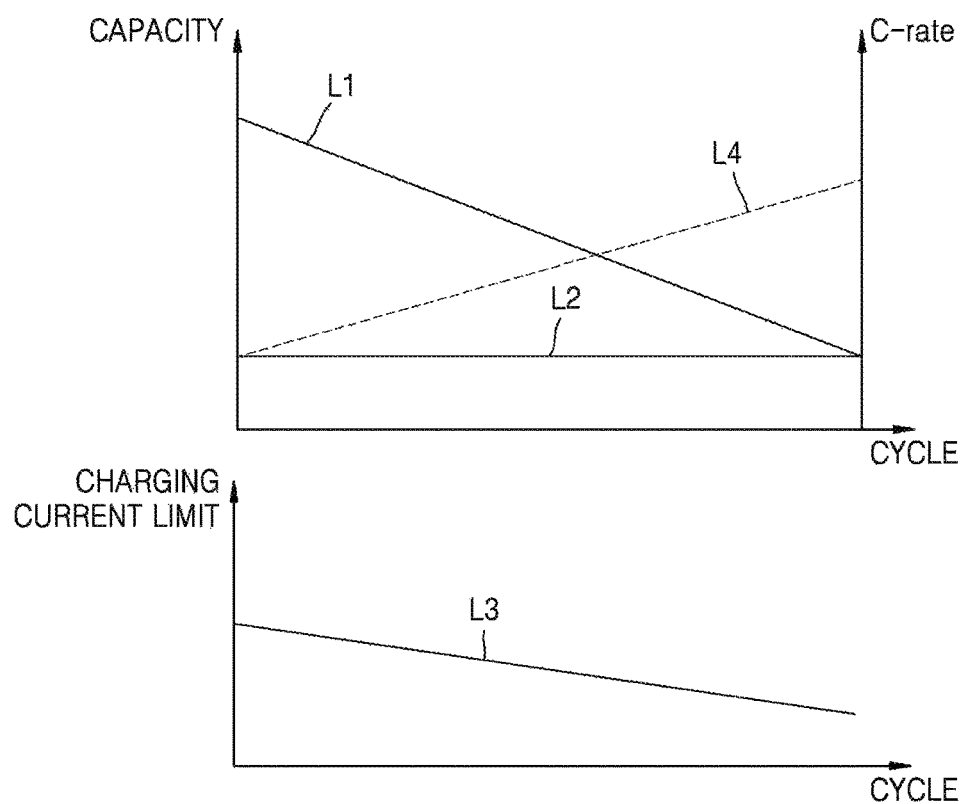
FIG. 6 illustrates graphs showing a capacity and a charging rate (C-rate) of a battery according to a method of operating the battery pack, according to an example embodiment of the present invention.

FIG. 6 illustrates graphs showing a capacity of the battery 20 and a C-rate of the battery 20 according to a method of operating the battery pack 10, according to an example embodiment of the present invention.

Referring to FIG. 6, the graphs show a C-rate of the battery 20 when the degradation of the battery 20 proceeds, in a case where the battery 20 is charged with a fixed amount of current and in a case where the battery pack 10 shown in FIG. 2 is charged. Upper graph of FIG. 6 shows the capacity and the C-rate of the battery 20 as the degradation of the battery 20 proceeds, and the lower graph shows the charging current limit as the degradation of the battery 20 proceeds.

As the number of charging/discharging operations of the battery 20 increases, the battery 20 degrades and the FCC of the battery 20 reduces. The C-rate of the battery 20 may be expressed by a ratio of the FCC of the battery 20 with respect to the magnitude of the charging current applied to the battery 20. Therefore, if the battery 20 is charged with the fixed amount of charging current, the FCC of the battery 20 decreases while the magnitude of the charging current applied to the battery 20 is constant as the battery 20 degrades, and thus, the C-rate increases.

In the graphs, a first line L1 denotes the FCC of the battery 20, which may decrease gradually. When the number of charging/discharging operations of the battery 20 increases, performance of the battery 20 may degrade and the FCC of the battery 20 may decrease.

A second line L2 denotes the C-rate of the battery 20, which is maintained to be constant or substantially constant even when the number of charging/discharging operations of the battery 20 increases. When the C-rate of the battery 20 is constant, a ratio of the capacity of the battery 20 with respect to the charging current applied to the battery 20 may be constant. In this case, because the capacity of the battery 20 decreases when the battery 20 degrades, the battery manager 203 may set the charging current limit so as to maintain a reference C-rate, which is the initial C-rate of the battery 20. For example, when it is assumed that the capacity of the battery 20 is 2000 mAh and a magnitude of a rated output current from a charger is 100 mA, the reference C-rate of the battery 20 is 0.5 C. When the capacity of the battery 20 is reduced to 1600 mAh because the battery 20 degrades due to the increase in the number of charging/discharging operations of the battery 20, the battery manager 203 may decrease the current applied to the battery 20 from 1000 mA to 800 mA so as to maintain the reference C-rate of the battery 20 at a constant or substantially constant value, that is, 0.5 C. When the C-rate of the battery 20 is constant or substantially constant, over-heating of the battery 20 may be prevented and the battery 20 may be stably charged.

A third line L3 denotes a variation in the charging current limit that allows the C-rate of the battery 20 to have a constant or substantially constant value even when the battery 20 degrades. The battery manager 203 decreases the charging current limit when the number of the charging/discharging operations increases, so that the ratio of the FCC of the battery 20 with respect to the charging current limit has a constant or substantially constant value.

A fourth line L4 of the graph denotes that the C-rate of the battery 20 increases when the number of the charging/discharging operations of the battery 20 increases. In this case, the battery pack 10 may not adjust the magnitude of the charging current applied to the battery 20 according to the deterioration degree, and thus, the battery 20 is charged with a fixed amount of current. For example, the battery 20 degrades due to the increase in the number of charging/discharging operations of the battery 20, and thus, the capacity of the battery 20 is reduced to 1600 mAh. In addition, when the charging current is constant or substantially constant, that is, 1000 mA, the C-rate of the battery 20 increases to 0.625 C. When the C-rate increases, heating of the battery 20 increases and this accelerates the degradation of the battery 20. That is, if the magnitude of the charging current is not controlled according to the deterioration degree of the battery, the deterioration of the battery is accelerated.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various suitable changes in form and details may be made therein without departing from the spirit and scope as defined by the following claims and equivalents thereof.

What is claimed is:

1. A battery pack comprising:
    a battery comprising at least one battery cell;
    a switching element comprising a charging switch and a discharging switch arranged on a high current path via which a charging current and a discharging current flow;
    a battery manager configured to monitor a voltage and a current of the battery, and to output a first driving signal to the charging switch and the discharging switch to control charging and discharging of the battery based on the voltage of the battery; and
    a switch driver configured to output a second driving signal for driving the charging switch according to a control signal from the battery manager,
    wherein the battery manager is further configured to set a charging current limit based on a deterioration degree of the battery, to compare a magnitude of the charging current applied to the battery with the charging current limit, and to output the first driving signal directly to the charging switch or to control the switch driver to output the second driving signal, based on the result of the comparison, so that a magnitude of the charging current applied to the battery is equal to or less than the charging current limit.

2. The battery pack of claim 1, wherein the battery manager is further configured to decrease the charging current limit of the battery as the battery degrades.

3. The battery pack of claim 1, wherein the battery manager is further configured to output a pulse width modulation (PWM) signal having a duty ratio, which is variable based on the magnitude of the charging current applied to the battery, to the switch driver as the control signal.

4. The battery pack of claim 3, wherein the battery manager is further configured to decrease the duty ratio of the PWM signal when the magnitude of the charging current applied to the battery exceeds the charging current limit, and to increase the duty ratio of the PWM signal when the magnitude of the charging current applied to the battery is less than the charging current limit.

5. The battery pack of claim 1, wherein the battery manager comprises:
    an analog front end (AFE) configured to sense a voltage and a current of the battery and to output the first driving signal to the charging switch and the discharging switch; and
    a micro-processor configured to control the AFE and the switch driver based on the voltage and current of the battery.

6. The battery pack of claim 1, wherein the battery manager is further configured to set a charging current limit of the battery so that a charging rate (C-rate) of the battery does not exceed a reference charging rate even when the battery degrades.

7. The battery pack of claim 6, wherein the charging current limit of the battery is in proportion to a full charge capacity (FCC) of the battery.

8. The battery pack of claim 1, wherein the battery manager is further configured to determine the deterioration degree of the battery based on a full charge capacity (FCC) of the battery.

9. The battery pack of claim 1, wherein the battery manager is further configured to determine the deterioration degree of the battery based on a number of charging/discharging cycles of the battery.

10. The battery pack of claim 1, further comprising a temperature sensor configured to sense a temperature of the battery.

11. The battery pack of claim 10, wherein the battery manager is further configured to set the charging current limit based on the deterioration degree of the battery and the temperature of the battery.

12. The battery pack of claim 11, wherein the battery manager is further configured to set the charging current limit as a first reference value when the temperature of the battery is room temperature, and to set the charging current limit as a second reference value when the temperature of the battery is between a first critical temperature and a second critical temperature, wherein the second reference value is dependent upon the first reference value that is set based on the deterioration degree of the battery.

13. A battery pack comprising:
    a battery comprising at least one battery cell;
    a switching element comprising a charging switch and a discharging switch arranged on a high current path via which a charging current and a discharging current flow;
    a battery manager configured to monitor a voltage and a current of the battery, and to output a first driving signal to the charging switch and the discharging switch to control charging and discharging of the battery based on the voltage of the battery; and
    a switch driver configured to output a second driving signal for driving the charging switch according to a control signal from the battery manager,
    wherein the battery manager is further configured to set a charging current limit based on a deterioration degree of the battery, and to control the charging switch by using the switch driver so that a magnitude of the charging current applied to the battery is equal to or less than the charging current limit,
    wherein the battery manager is further configured to output a pulse width modulation (PWM) signal having a duty ratio, which is variable based on the magnitude of the charging current applied to the battery, to the switch driver as the control signal, and
    wherein, when the duty ratio of the PWM signal reaches about 100%, the battery manager is further configured to output a turning-on signal for turning on the charging switch as the first driving signal and to control the switch driver to output the second driving signal in a high impedance (Hi-Z) state.

14. A battery pack comprising:
- a battery comprising at least one battery cell;
- a switching element comprising a charging switch and a discharging switch arranged on a high current path via which a charging current and a discharging current flow:
- a battery manager configured to monitor a voltage and a current of the battery, and to output a first driving signal to the charging switch and the discharging switch to control charging and discharging of the battery based on the voltage of the battery; and
- a switch driver configured to output a second driving signal for driving the charging switch according to a control signal from the battery manager, wherein the battery manager is further configured to set a charging current limit based on a deterioration degree of the battery, and to control the charging switch by using the switch driver so that a magnitude of the charging current applied to the battery is equal to or less than the charging current limit, wherein the battery manager is further configured to output a pulse width modulation (PWM) signal having a duty ratio, which is variable based on the magnitude of the charging current applied to the battery, to the switch driver as the control signal, and wherein, when the duty ratio of the PWM signal is less than 100%, the battery manager is further configured to output the first driving signal in a Hi-Z state, and to control the switch driver to output the second driving signal having a duty ratio corresponding to the duty ratio of the PWM signal.

\* \* \* \* \*